United States Patent
Park

(10) Patent No.: US 7,358,135 B2
(45) Date of Patent: Apr. 15, 2008

(54) METHOD OF FORMING RESISTOR OF FLASH MEMORY DEVICE

(75) Inventor: Byung Soo Park, Icheon-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 138 days.

(21) Appl. No.: 11/479,147

(22) Filed: Jun. 30, 2006

(65) Prior Publication Data

US 2008/0003762 A1  Jan. 3, 2008

(30) Foreign Application Priority Data

Dec. 28, 2005  (KR) .................. 10-2005-0131381

(51) Int. Cl.
*H01L 21/336* (2006.01)
(52) U.S. Cl. ............... 438/257; 438/238; 438/384; 438/259; 438/264
(58) Field of Classification Search ........... 438/210, 438/238, 384, 257, 259, 264, 593–594
See application file for complete search history.

(56) References Cited

U.S. PATENT DOCUMENTS 5,879,983 A * 3/1999 Segawa et al. ............. 438/253

* cited by examiner

*Primary Examiner*—Mary Wilczewski
*Assistant Examiner*—Toniae M Thomas
(74) *Attorney, Agent, or Firm*—Townsend and Townsend and Crew LLP

(57) ABSTRACT

A method of forming a resistor of a flash memory device includes etching an isolation structure provided on a semiconductor substrate to form a first trench. A polysilicon structure is formed within the first trench of the isolation structure. A dielectric layer is formed on the polysilicon structure. A polysilicon layer is formed over the dielectric layer. The polysilicon layer is etched to define second and third trenches in the polysilicon layer. The second and third trenches separates the polysilicon layer into first, second, and third sections, where the first and third section contact the polysilicon structure, and the second section is separated from the first and third sections. An insulating film is formed over the etched polysilicion layer, the insulating film filling the second and third trenches. the first section of the polysilicon layer, the polysilicon structure, and the third section of the polysilicon layer define a resistor.

12 Claims, 5 Drawing Sheets

METHOD OF FORMING RESISTOR OF FLASH MEMORY DEVICE

BACKGROUND

The present invention generally relates to a method of manufacturing a flash memory device, and more particularly, to a method of forming a resistor of a flash memory device, for forming a voltage divider resistor.

In fabricating a flash memory, a pump regulator employs a voltage divider resistor. The resistor must be insensitive to a temperature and a voltage. A gate or metal resistor has a low resistance value. Accordingly, a large area is required and drawing rules are complicated in order to construct a resistor of 10 KΩ or more. For this reason, only the polysilicon layer of the floating gate used in the flash memory device is used as the resistor in the conventional art. The polysilicon layer was appropriate for the resistor since it has less variation depending on a bias and temperature. In contrast, a junction resistor having a value of several hundreds of about ohm/sq. is formed as the junction and is great in variation depending on a bias and temperature. Accordingly, the junction resistor is not appropriate to use for the resistor.

FIGS. 1 and 2 are cross-sectional views illustrating a method of forming a polysilicon resistor of a NAND flash memory device by employing the conventional Shallow Trench Isolation (STI) process. FIGS. 1 and 2 illustrate a method of forming a resistor at a predetermined region of a peri region while forming a gate in which a floating gate and a control gate are laminated in a cell region.

Referring to FIG. 1, an isolation structure 12 of a Shallow Trench Isolation (STI) structure is formed on a semiconductor substrate 10. A first polysilicon layer 14 and a dielectric layer 16 are sequentially formed on the isolation structure 12.

A predetermined region of the dielectric layer 16 is etched and a second polysilicon layer 18 is formed on the entire structure. A predetermined region of the second polysilicon layer 18 is etched so that a predetermined region of the dielectric layer 16 is exposed, so that a portion in which the first polysilicon layer 14 and the second polysilicon layer 18 are connected is separated from a portion in which the second polysilicon layer 18 is formed on the dielectric layer 16.

An interlayer insulating film 20 is formed on the entire structure. A predetermined region of the interlayer insulating film 20 is etched to expose a predetermined region of the second polysilicon layer 18 connected to the first polysilicon layer 14, thereby forming a contact hole. A conductive layer is formed to fill the contact hole. The conductive layer is patterned to form a contact plug 22 and a line layer 24.

Referring to FIG. 2, an isolation structure 12 is formed on a semiconductor substrate 10. A first polysilicon layer 14, a dielectric layer 16, and a second polysilicon layer 18 are formed on the isolation structure 12. A part of the second polysilicon layer 18 formed on the dielectric layer 16 is etched so that the second polysilicon layer 18 remains only in a predetermined region on the dielectric layer 16.

An interlayer insulating film 20 is formed on the entire structure. The interlayer insulating film 20, the dielectric layer 16, and a predetermined region of the first polysilicon layer 14 are etched to form a contact hole. A conductive layer is formed to plug the contact hole. The conductive layer is patterned to form a contact plug 22 and a line layer 24.

However, if the contact plug 22 is directly connected to the first polysilicon layer 14 as shown in FIG. 2, it becomes difficult to secure process margin since the thickness of the first polysilicon layer is lowered due to the high integration level. Furthermore, as devices shrink, the margin of the photolithography process is shortened in constructing the polysilicon layer in view of the flash memory device. This makes exact patterning difficult.

A Self-Aligned Floating Gate (SAFG) structure has been proposed to resolve the above issue. If the SAFG structure is applied, however, the polysilicon layer is formed only on the active region, and is not formed on the field region.

SUMMARY OF THE INVENTION

An embodiment of the present invention provides a method of forming a resistor of a flash memory device, for forming the resistor employing the SAFG process.

According to an embodiment of the present invention, there is provided a method of forming a resistor of a flash memory device, including forming an isolation structure on a semiconductor substrate and etching a predetermined region of the isolation structure, forming a trench; forming a first polysilicon layer on the entire structure so that the trench is filled, and polishing the first polysilicon layer until a top surface of the isolation structure is exposed; forming a dielectric layer pattern on the first polysilicon layer and then forming a second polysilicon layer on the entire structure; etching predetermined regions of the second polysilicon layer so that predetermined regions of the dielectric layer pattern are exposed, whereby a first portion in which the first polysilicon layer and the second polysilicon layer are connected is separated from a second portion in which the second polysilicon layer is formed on the dielectric layer pattern; and forming an interlayer insulating film on the entire structure, and forming contact plugs within predetermined regions of the interlayer insulating film and the second polysilicon layer.

According to another embodiment of the present invention, there is provided a method of forming a resistor of a flash memory device, including laminating a tunnel oxide film and a first polysilicon layer on a predetermined region of a semiconductor substrate, and forming an isolation structure between the laminated tunnel oxide film and first polysilicon layer; forming a dielectric layer and a capping polysilicon layer on the first polysilicon layer, etching a predetermined region of the capping polysilicon layer, and then stripping the dielectric layer using the capping polysilicon layer pattern as a mask; forming a second polysilicon layer on the entire structure, etching predetermined regions of the second polysilicon layer so that predetermined regions of the dielectric layer are exposed, whereby a first portion in which the first polysilicon layer and the second polysilicon layer are connected is separated from a second portion in which the second polysilicon layer is formed on the dielectric layer; and forming an interlayer insulating film on the entire structure, and forming contact plugs within predetermined regions of the interlayer insulating film and the second polysilicon layer.

In yet another embodiment, a method of forming a resistor of a flash memory device includes etching an isolation structure provided on a semiconductor substrate to form a first trench. A polysilicon structure is formed within the first trench of the isolation structure. A dielectric layer is formed on the polysilicon structure. A polysilicon layer is formed over the dielectric layer. The polysilicon layer is etched to define second and third trenches in the polysilicion layer.

The second and third trenches separates the polysilicon layer into first, second, and third sections, where the first and third section contact the polysilicon structure, and the second section is separated from the first and third sections. An insulating film is formed over the etched polysilicion layer, the insulating film filling the second and third trenches. The first section of the polysilicon layer, the polysilicon structure, and the third section of the polysilicon layer define a resistor.

In yet another embodiment, the dielectric layer includes a plurality of layers. The method further comprises stripping a top layer of the dielectric layer; and forming first and second contact plugs to couple the first and second sections of the polysilicon layer.

BRIEF DESCRIPTION OF THE DRAWINGS

A more complete appreciation of the invention will be readily apparent as the same becomes better understood by reference to the following detailed description when considered in conjunction with the accompanying drawings in which like reference symbols indicate the same or similar components, wherein.

DETAILED DESCRIPTION OF EMBODIMENTS

Figure 1:
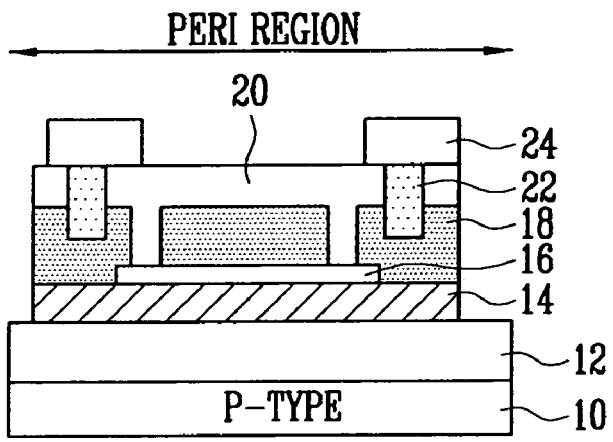
FIGS. 1 and 2 are cross-sectional views illustrating a method of forming a polysilicon resistor of a flash memory device by employing the conventional STI process.
Figure 2:
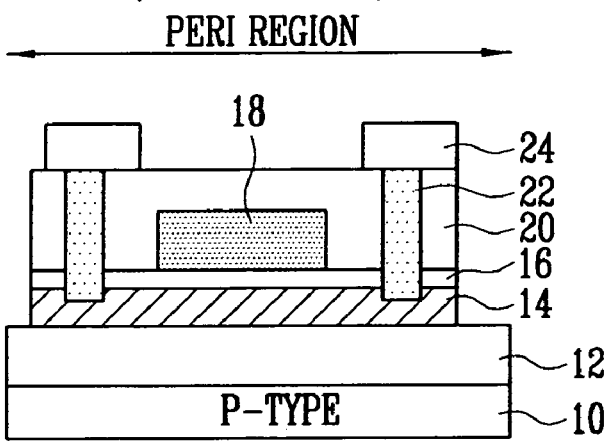
Figure 3A:
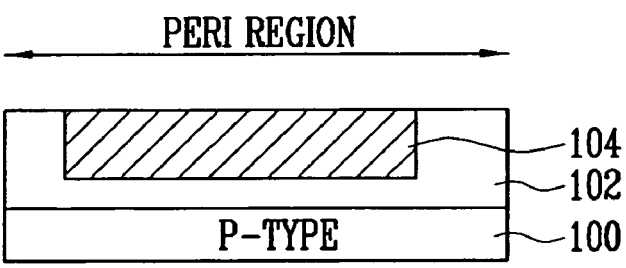
FIGS. 3A and 3B are cross-sectional views illustrating a method of forming a resistor of a flash memory device according to one embodiment of the present invention.
Figure 3B:
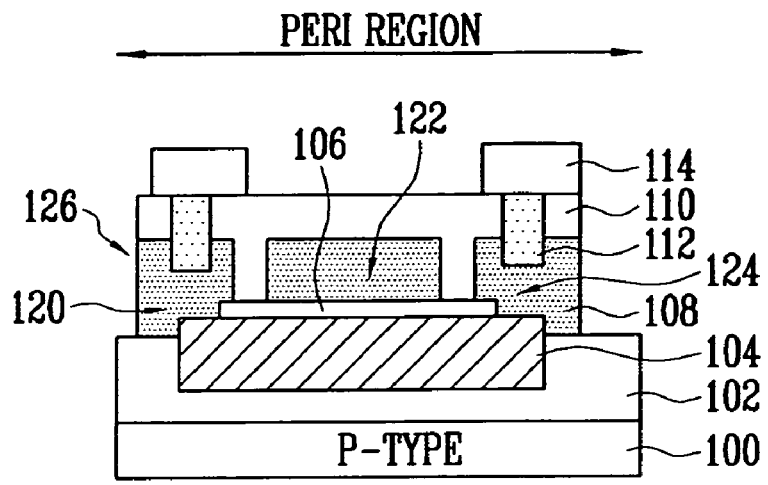

FIGS. 3A and 3B are cross-sectional views illustrating a method of forming a resistor of a flash memory device according to one embodiment of the present invention. FIGS. 3A and 3B illustrate a method of forming a resistor in a predetermined region of a peri region while forming a gate in which a floating gate and a control gate are laminated in a cell region.

Referring to FIG. 3A, an isolation structure 102 is formed on a P-type semiconductor substrate 100. A Polysilicon Resistor Mask (PRM) pattern (not shown) is formed on the isolation structure 102. The isolation structure 102 is etched using the PRM pattern (not shown), forming a trench.

A first polysilicon layer (not shown) is formed on the entire structure so that the trench is filled. The first polysilicon layer is polished until a top surface of the isolation structure 102 is exposed, thus forming a first polysilicon structure 104 within the isolation structure 102. The polishing process may be performed using an etch-back or Chemical Mechanical Polishing (CMP) process.

Referring to FIG. 3B, after a dielectric layer 106 is formed on the entire structure, a predetermined region of the dielectric layer 106 is etched. At this time, the top surface of the isolation structure 102 is also partially removed by the etch process of the dielectric layer 106, leaving dielectric layer 106 over first polysilicon layer 104.

A second polysilicon layer 108 is formed on the entire structure. A predetermined region of the second polysilicon layer 108 is etched so that a predetermined region of the dielectric layer 106 is exposed. The second polysilicon layer is divided into a first section 120, a second section 122, and a third section 124. The second section formed on the dielectric layer 106 is separated from the first and third sections 120 and 124. A resistor 126 is accordingly defined by the first section 120, the first polysilicon structure 104, and the third section 124.

An interlayer insulating film 110 is formed on the entire structure. A predetermined region of the interlayer insulating film 110 is etched to expose a predetermined region of the second polysilicon layer 108, which is connected to the first polysilicon structure 104, thereby forming a contact hole. A conductive layer is formed so that the contact hole is plugged. The conductive layer is patterned to form a contact plug 112 and a line layer 114.

As described above, the semiconductor substrate 100 is P type in the present embodiment. This is because only a positive voltage is used and only the positive bias is controlled in the polysilicon resistor. In this case, it is advantageous that the doping level be low. Furthermore, by using the P-type semiconductor substrate 100, parasitic capacitance between the polysilicon resistor and the semiconductor substrate 100 can be reduced.

Figure 4:
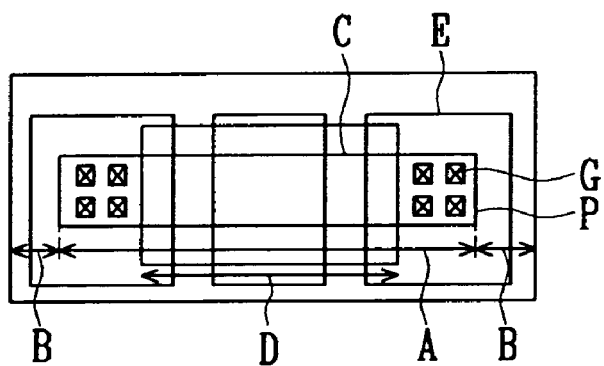
FIG. 4 is a first layout diagram illustrating a method of forming a resistor of a flash memory device according to another embodiment of the present invention.

FIG. 4 is a first layout diagram illustrating a method of forming a resistor of a flash memory device according to another embodiment of the present invention.

An active region A and a field region B are defined by an isolation structure formed in a predetermined region of a semiconductor substrate. A first polysilicon structure P is formed in the active region A, and a dielectric layer C and a capping polysilicon layer D are overlapped on the first polysilicon layer P. A second polysilicon layer E is formed on the dielectric layer C.

A predetermined region of the second polysilicon layer E is etched so that a portion in which the first polysilicon structure P and the second polysilicon layer E are connected is separated from a portion in which the second polysilicon layer E is formed on the dielectric layer C. Contact plugs G are formed at predetermined regions of the separated second polysilicon layer E.

Figure 5:
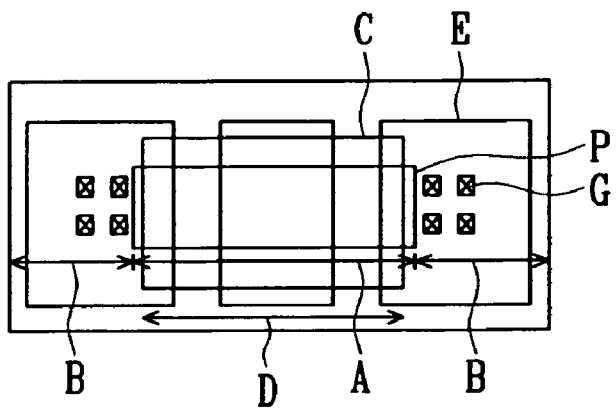
FIG. 5 is a second layout diagram illustrating a method of forming a resistor of a flash memory device according to an embodiment of the present invention.

FIG. 5 is a second layout diagram illustrating a method of forming a resistor of a flash memory device according to another embodiment of the present invention.

An active region A and a field region B are defined by an isolation structure formed in a predetermined region of a semiconductor substrate. A first polysilicon structure P is formed in the active region A, and a dielectric layer C and a capping polysilicon layer D are overlapped on the first polysilicon structure P. A second polysilicon layer E is formed on the dielectric layer C.

A predetermined region of the second polysilicon layer E is etched so that a portion in which the first polysilicon structure P and the second polysilicon layer E are connected is separated from a portion in which the second polysilicon layer E is formed on the dielectric layer C. Contact plugs G are formed at predetermined regions of the separated second polysilicon layer E formed on the field region B. This corresponds to a layout diagram as shown in FIG. 4. In this case, the contact plugs G may be formed within the active region A as shown in FIG. 4 or may be formed within the field region B as shown in FIG. 5.

FIGS. 6A to 6D are cross-sectional views illustrating a method of forming a resistor of a flash memory device according to one embodiment of the present invention. FIGS. 6A to 6D illustrate a method of forming the resistor in a predetermined region of the peri region while forming the gate in which the floating gate and the control gate are laminated in the cell region.

Figure 6A:
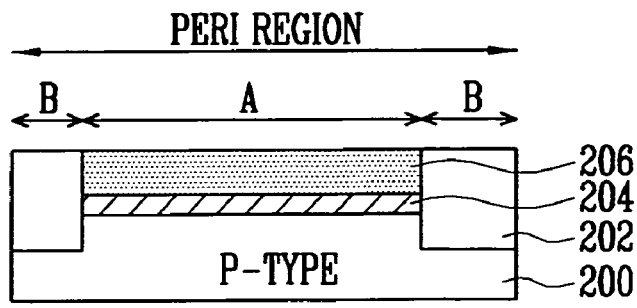
FIGS. 6A to 6D are cross-sectional views illustrating a method of forming a resistor of a flash memory device according to another embodiment of the present invention.

Referring to FIG. 6A, a buffer oxide film (not shown) and a nitride film (not shown) are formed on a P-type semiconductor substrate 200. The nitride film, the buffer oxide film, and a part of the semiconductor substrate 200 are etched to form a trench.

An oxide film is formed on the entire structure so that the trench is filled. The oxide film is polished until a top surface of the nitride film is exposed, thereby forming first and second isolation structures 202A and 202B. The polishing process may be performed using an etch-back or CMP process. The nitride film and the buffer oxide film are then stripped.

An active region A and a field region B are defined between first and second the isolation 202A and 202B. A gate oxide film 204 is formed on the active region A of the semiconductor substrate 200. The gate oxide film 204 may be formed to a thickness of about 300 to about 500 angstroms (Å). The gate oxide film may also be referred as a tunnel oxide film.

A first polysilicon layer (not shown) is formed on the gate oxide film 204. A first polysilicon structure 206 is formed by polishing the first polysilicon layer until the top surface of the isolation structures 202 is exposed. The first polysilicon structure 206, accordingly, is flushed to the upper surface of the first and second isolation structures at this time. The first polysilicon structure 206 may be formed to a thickness of 0.1 um to 1 um.

Figure 6B:
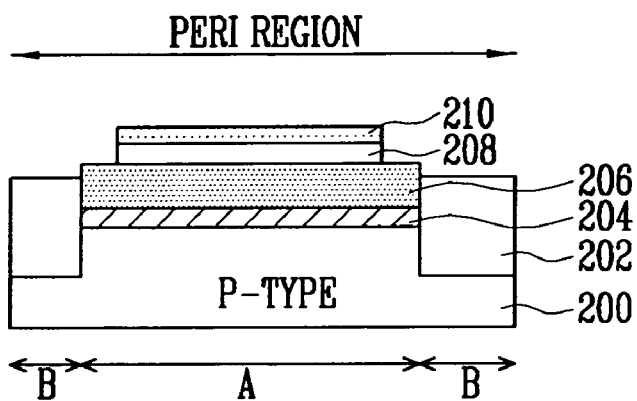

Referring to FIG. 6B, a dielectric layer 208 and a capping polysilicon layer 210 are formed on the entire structure. A predetermined region of the capping polysilicon layer 210 is etched. The dielectric layer 208 is etched using the etched capping polysilicon layer 210 as a mask. At this time, a top surface of the isolation structures 202 is also etched by the etch process of the dielectric layer 208.

The reason why the capping polysilicon layer 210 is formed on the dielectric layer 208 and the dielectric layer 208 is then stripped or etched using the capping polysilicon layer 210 as a mask is that the oxide film of the ONO film (i.e., the dielectric layer 208) is not lost by attack when the photoresist pattern is stripped. A bias can be applied by stripping the dielectric layer 208 below a contact to be formed in a subsequent process.

Figure 6C:
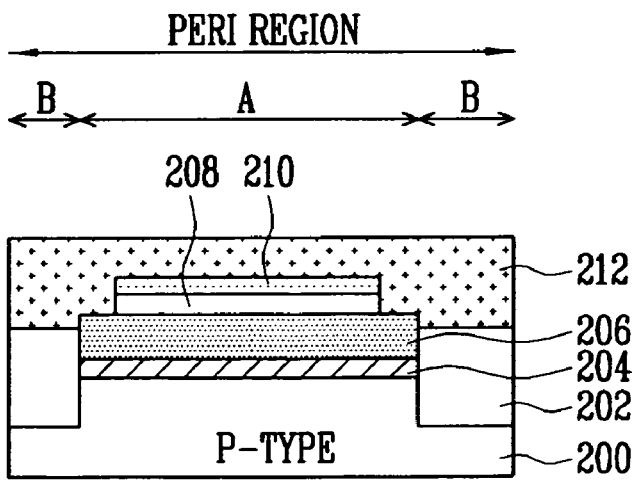

Referring to FIG. 6C, a second polysilicon layer 212 is formed on the entire structure. At this time, the second polysilicon layer 212 is formed on the capping polysilicon layer 210, so that the capping polysilicon layer 210 contacts the second polysilicon layer 212.

Figure 6D:
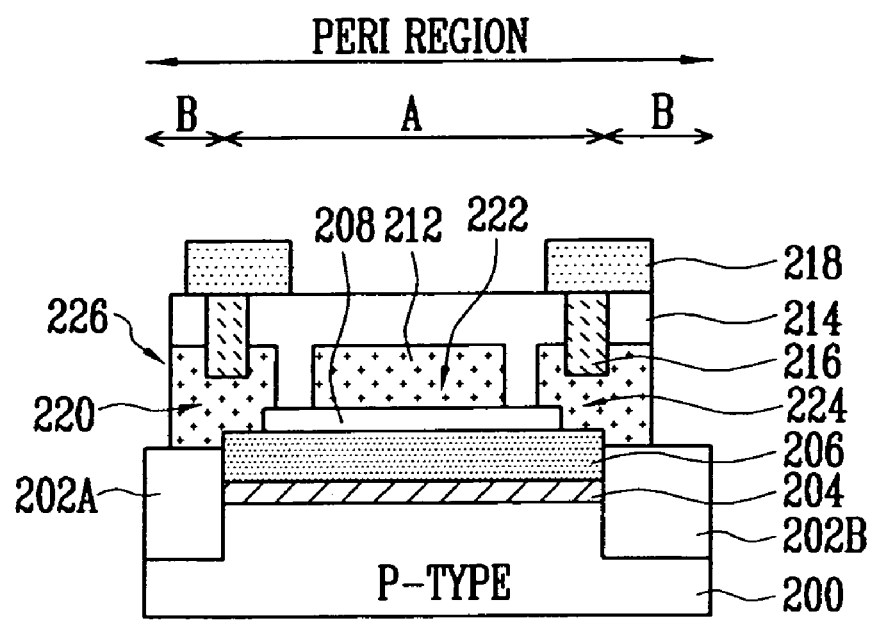

Referring to FIG. 6D, predetermined regions of the second polysilicon layer 212 are etched so that predetermined regions of the dielectric layer 208 are exposed. The second polysilicon layer 212 is divided into a first section 220, a second section 222, and a third section 224. The second section formed on the dielectric layer 206 is separated from the first and third sections 220 and 224. A resistor 226 is accordingly defined by the first section 220, the first polysilicon structure 206, and the third section 224.

Accordingly, a portion in which the first polysilicon structure 206 and the second polysilicon layer 212 are connected is separated from a portion in which the second polysilicon layer 212 is formed on the dielectric layer 208.

At this time, since the second polysilicon layers 212 are separated from each other, the second polysilicon layer 212 formed on the dielectric layer 208 does not serve as a resistor although a voltage is applied. In addition, a width separating a portion in which the first polysilicon structure 206 and the second polysilicon layer 212 are connected and a portion in which the second polysilicon layer 212 is formed on the dielectric layer 208 may have any value if the second polysilicon layers 212 are separated and insulated from each other.

An interlayer insulating film 214 is formed on the entire structure. A predetermined region of the interlayer insulating film 214 is etched to expose a predetermined region of the second polysilicon layer 212 connected to the first polysilicon structure 206, thereby forming a contact hole. A conductive layer is formed so that the contact hole is filled. The conductive layer is patterned to form a contact plug 216 and a line layer 218.

As described above, the semiconductor substrate 200 is P type. This is because only a positive voltage is used and only the positive bias is controlled in the polysilicon resistor. In this case, it is advantageous that the doping level be low. Furthermore, by using the P-type semiconductor substrate 200, parasitic capacitance between the polysilicon resistor and the semiconductor substrate 200 can be reduced.

As described above, in the resistor formation method, the contact plug 216 may be directly connected to the first polysilicon structure 206 by etching the second polysilicon layer 212 formed on the dielectric layer 208 or the second polysilicon layer 212 connected to the first polysilicon layer 106.

In addition, the capacitance between the polysilicon resistor and the semiconductor substrate 200 can be reduced by injecting n-type ions into below the gate oxide film 204 in order to increase the width of the resistor.

Figure 7:
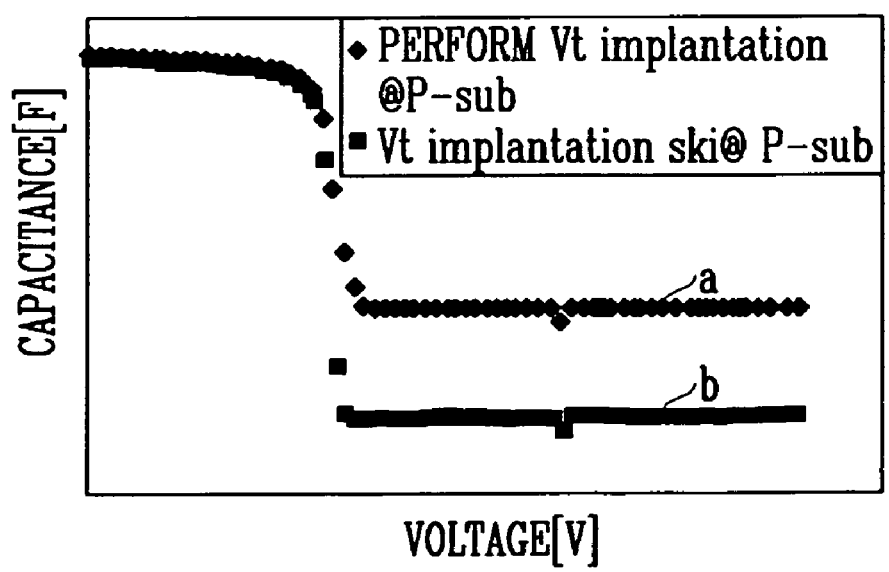
FIG. 7 is a graph illustrating capacitance depending on whether a voltage is applied to a P-type semiconductor substrate.

FIG. 7 is a graph illustrating capacitance depending on whether a voltage is applied to a P-type semiconductor substrate.

In FIG. 7, "a" is an example in which a voltage is applied to a P-type semiconductor substrate, and "b" is an example in which a voltage is not applied to a P-type semiconductor substrate. From FIG. 7, it can be seen that the example "b" in which the voltage is not applied has a lower capacitance.

Figure 8:
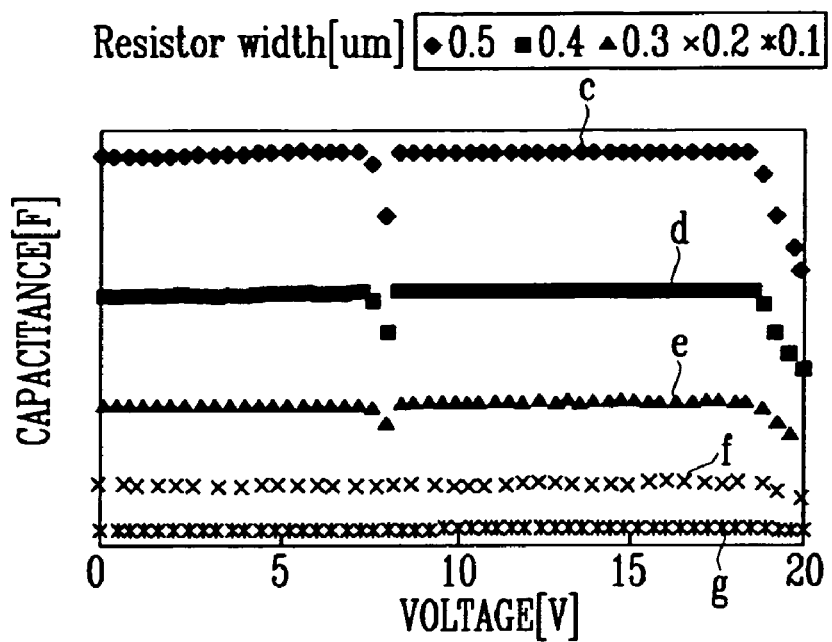
FIG. 8 is a graph showing ripples of a program bias, which are formed through a pump controller and will be applied to a word line when a capacitance value is increased.

FIG. 8 is a graph showing ripples of a program bias, which are formed through a pump controller and will be applied to a word line when a capacitance value is increased.

In FIG. 8, "c" denotes a capacitance value when the first polysilicon resistor has a thickness of 0.5 um, "d" denotes a capacitance value when the first polysilicon resistor has a thickness of 0.4 um, "e" denotes a capacitance value when the first polysilicon resistor has a thickness of 0.3 um, "f" denotes a capacitance value when the first polysilicon resistor has a thickness of 0.2 um, and "g" denotes a capacitance value when the first polysilicon resistor has a thickness of 0.1 um. From FIG. 8, it can be seen that the smaller the thickness of the first polysilicon resistor, the lower the capacitance value.

Figure 9:
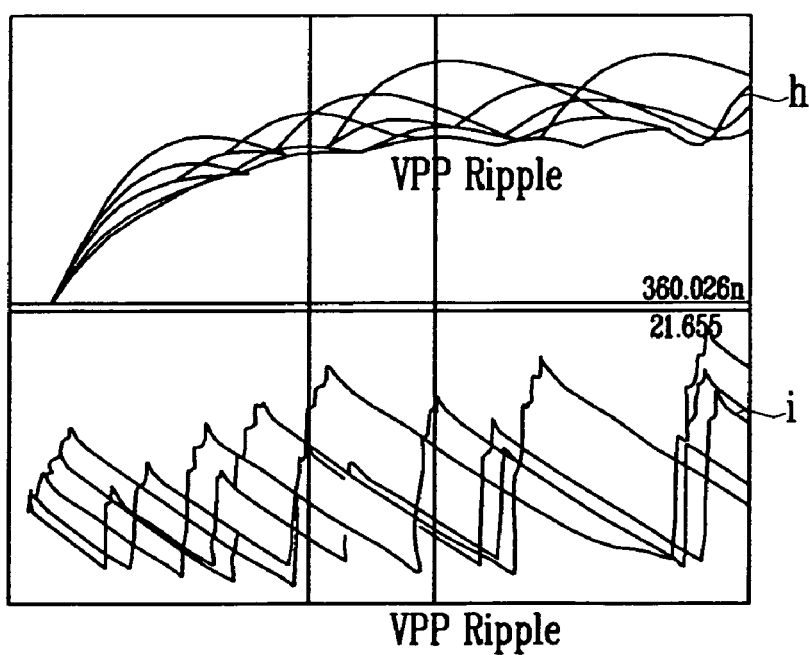
FIG. 9 is a graph showing the result of simulating the ripple phenomenon of the program voltage when the capacitance value is high.

FIG. 9 is a graph showing the result of simulating the ripple phenomenon of the program voltage when the capacitance value is high.

In FIG. 9, "h" denotes ripples appearing at word lines and "i" denotes ripples appearing at Vpp. When a voltage is 0.5 V or more, ripples are severely generated, making impossible a stabilized operation.

As described above, according to the present invention, a stabilized polysilicon resistor can be formed by controlling a critical dimension (CD) in an isolation film process. It is therefore possible to obtain a high voltage stably.

Furthermore, the properties of devices can be improved and an additional process of forming a polysilicon resistor can be omitted. It is therefore possible to form devices from an economic point of view.

Furthermore, a polysilicon layer is formed within a predetermined region of an isolation film using PRM. It is therefore possible to form the polysilicon resistor even on the field region.

While the invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A method of forming a resistor of a flash memory device, the method comprising:
    etching an isolation structure provided on a semiconductor substrate to form a first trench;
    forming a polysilicon structure within the first trench of the isolation structure;
    forming a dielectric layer over the polysilicon structure;
    forming a polysilicon layer over the dielectric layer;
    etching the polysilicon layer to define second and third trenches in the polysilicon layer, the second and third trenches separating the polysilicon layer into first, second, and third sections, the first and third section contacting the polysilicon structure, the second section being separated from the first and third sections; and
    forming an insulating film over the etched polysilicon layer, the insulating film filling the second and third trenches,
    wherein the first section of the polysilicon layer, the polysilicon structure, and the third section of the polysilicon layer define a resistor.

2. The method as claimed in claim 1, wherein the dielectric layer includes a plurality of layers, the method further comprising:
    stripping a top layer of the dielectric layer; and
    forming first and second contact plugs to couple the first and second sections of the polysilicon layer.

3. The method as claimed in claim 1, wherein the semiconductor substrate is P-type.

4. A method of forming a resistor of a flash memory device, the method comprising:
    laminating a tunnel oxide film and a first polysilicon layer on a predetermined region of a semiconductor substrate, and forming an isolation film between the laminated tunnel oxide film and the first polysilicon layer;
    forming a dielectric layer and a capping polysilicon layer on the first polysilicon layer, etching a predetermined region of the capping polysilicon layer, and then stripping the dielectric layer using the capping polysilicon layer pattern as a mask;
    forming a second polysilicon layer on the entire structure, etching predetermined regions of the second polysilicon layer so that predetermined regions of the dielectric layer are exposed, whereby a first portion in which the first polysilicon layer and the second polysilicon layer are connected is separated from a second portion in which the second polysilicon layer is formed on the dielectric layer; and
    forming an interlayer insulating film on the entire structure, and forming contact plugs within predetermined regions of the interlayer insulating film and the second polysilicon layer.

5. The method as claimed in claim 4, wherein during the etch process of the dielectric layer, a top surface of the isolation film is stripped.

6. The method as claimed in claim 4, wherein the contact plugs are directly connected to the first polysilicon layer by stripping the second polysilicon layer connected to the first polysilicon layer.

7. The method as claimed in claim 4, wherein the second polysilicon layer formed on the dielectric layer is all stripped.

8. The method as claimed in claim 4, wherein the semiconductor substrate is P-type.

9. The method as claimed in claim 4, wherein the tunnel oxide film has a thickness of about 300 Å to about 500 Å.

10. The method as claimed in claim 4, wherein the first polysilicon layer has a thickness of about 0.1 um to about 1 um.

11. The method as claimed in claim 4, wherein the contact plugs are directly connected to the first polysilicon layer.

12. The method as claimed in claim 4, further comprising injecting n-type ions into below the tunnel oxide film.

* * * * *